United States Patent
Park et al.

(10) Patent No.: US 9,159,884 B2
(45) Date of Patent: Oct. 13, 2015

(54) LIGHT EMITTING DEVICE HAVING CAVITY SIDE SURFACES WITH RECESSES

(71) Applicant: LG INNOTEK CO., LTD., Seoul (KR)

(72) Inventors: Hyung Hwa Park, Seoul (KR); Joo Seok Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 13/971,156

(22) Filed: Aug. 20, 2013

(65) Prior Publication Data

US 2013/0334556 A1    Dec. 19, 2013

Related U.S. Application Data

(63) Continuation of application No. 13/075,527, filed on Mar. 30, 2011, now Pat. No. 8,525,213.

(30) Foreign Application Priority Data

Mar. 30, 2010  (KR) .................. 10-2010-0028840
Mar. 30, 2010  (KR) .................. 10-2010-0028841

(51) Int. Cl.
  *H01L 33/48*    (2010.01)
  *H01L 33/54*    (2010.01)
  (Continued)

(52) U.S. Cl.
  CPC ............ *H01L 33/483* (2013.01); *H01L 33/486* (2013.01); *F21K 9/13* (2013.01); *F21Y 2101/02* (2013.01); *H01L 33/54* (2013.01); *H01L 2224/48091* (2013.01); *H01L 2224/48247* (2013.01); *H01L 2933/005* (2013.01)

(58) Field of Classification Search
  CPC ..................................................... H01L 33/483
  USPC ............. 257/98, 99, 100, E33.056, E33.057, 257/E33.058, E33.059
  See application file for complete search history.

(56) References Cited

U.S. PATENT DOCUMENTS 5,696,862 A * 12/1997 Hauer et al. .................... 385/88
6,060,729 A    5/2000 Suzuki et al.
(Continued)

FOREIGN PATENT DOCUMENTS

JP    2002-329892 A    11/2002
JP    2008-034799 A    2/2008
(Continued)

OTHER PUBLICATIONS

Korean Office Action dated Apr. 7, 2011 issued in Application No. 10-2010-0028841.
(Continued)

*Primary Examiner* — Ida M Soward
(74) *Attorney, Agent, or Firm* — Ked & Associates, LLP

(57) ABSTRACT

Provided are a light emitting device and a light unit including the same. The light emitting device includes a body, a first cavity disposed at a center of the body, the first cavity having an opened upper side, a second cavity disposed around an upper portion of the body, the second cavity being spaced from the first cavity, first and second lead electrodes disposed within the first cavity, a light emitting chip disposed on at least one of the first and second lead electrodes, and a first molding member in the first cavity. The second cavity has an upper width grater than a lower width thereof and a side surface of the second cavity is formed of a vertical side surface with respect to a top surface of the body.

20 Claims, 15 Drawing Sheets

(51) Int. Cl.
*F21K 99/00* (2010.01)
*F21Y 101/02* (2006.01)

(56) References Cited

U.S. PATENT DOCUMENTS

| | | | |
|---|---|---|---|
| 6,377,385 B1 | 4/2002 | Saito | |
| 6,924,514 B2* | 8/2005 | Suenaga | 257/98 |
| 7,210,807 B2* | 5/2007 | Sakamoto et al. | 362/84 |
| 7,491,981 B2 | 2/2009 | Yamaguchi et al. | |
| 7,499,288 B2 | 3/2009 | Tanaka et al. | |
| 7,531,845 B2 | 5/2009 | Oshio et al. | |
| 7,652,297 B2* | 1/2010 | Hon et al. | 257/81 |
| 7,709,940 B2* | 5/2010 | Pan et al. | 257/678 |
| 7,815,343 B2* | 10/2010 | Nii et al. | 362/311.03 |
| 7,830,079 B2 | 11/2010 | Tamaki et al. | |
| 7,943,946 B2 | 5/2011 | Ito | |
| 7,980,731 B2 | 7/2011 | Ohashi et al. | |
| 7,985,980 B2 | 7/2011 | Matsuda et al. | |
| 8,106,418 B2* | 1/2012 | Bando | 257/99 |
| 8,129,741 B2 | 3/2012 | Lee et al. | |
| 8,159,000 B2* | 4/2012 | Lee et al. | 257/99 |
| 8,227,824 B2 | 7/2012 | Kim | |
| 8,288,793 B2* | 10/2012 | Kim et al. | 257/99 |
| 8,704,264 B2* | 4/2014 | Sheu et al. | 257/99 |
| 8,928,008 B2* | 1/2015 | Kim et al. | 257/81 |
| 8,941,134 B2* | 1/2015 | Loh et al. | 257/93 |
| 2004/0016873 A1 | 1/2004 | Kida et al. | |
| 2004/0046242 A1 | 3/2004 | Asakawa | |
| 2004/0075100 A1 | 4/2004 | Bogner et al. | |
| 2004/0084681 A1 | 5/2004 | Roberts | |
| 2004/0135156 A1 | 7/2004 | Takenaka | |
| 2004/0208210 A1* | 10/2004 | Inoguchi | 372/36 |
| 2004/0232435 A1 | 11/2004 | Hofer et al. | |
| 2004/0256706 A1 | 12/2004 | Nakashima | |
| 2005/0145991 A1* | 7/2005 | Sakamoto et al. | 257/604 |
| 2005/0151149 A1 | 7/2005 | Chia et al. | |
| 2005/0280014 A1 | 12/2005 | Park et al. | |
| 2006/0278882 A1* | 12/2006 | Leung et al. | 257/98 |
| 2007/0278511 A1 | 12/2007 | Ohno et al. | |
| 2008/0012036 A1* | 1/2008 | Loh et al. | 257/99 |
| 2008/0023714 A1* | 1/2008 | Chae et al. | 257/98 |
| 2008/0023721 A1* | 1/2008 | Lee et al. | 257/99 |
| 2008/0029775 A1 | 2/2008 | Liu et al. | |
| 2008/0054287 A1* | 3/2008 | Oshio et al. | 257/99 |
| 2008/0083931 A1* | 4/2008 | Bando et al. | 257/99 |
| 2008/0142831 A1 | 6/2008 | Su | |
| 2008/0142832 A1 | 6/2008 | Chen et al. | |
| 2008/0224162 A1* | 9/2008 | Min et al. | 257/98 |
| 2009/0237592 A1 | 9/2009 | Mizutani | |
| 2009/0289272 A1 | 11/2009 | Kim et al. | |
| 2010/0155755 A1 | 6/2010 | Dong | |
| 2010/0163914 A1 | 7/2010 | Urano | |
| 2010/0327302 A1 | 12/2010 | Wang et al. | |
| 2011/0002587 A1 | 1/2011 | Bogner et al. | |
| 2011/0006330 A1* | 1/2011 | Leung et al. | 257/98 |
| 2011/0037091 A1* | 2/2011 | Fushimi | 257/98 |
| 2011/0220951 A1* | 9/2011 | Kim et al. | 257/98 |
| 2012/0080701 A1* | 4/2012 | Kim et al. | 257/98 |
| 2014/0077249 A1* | 3/2014 | Cho et al. | 257/99 |
| 2014/0145205 A1* | 5/2014 | Kong et al. | 257/76 |

FOREIGN PATENT DOCUMENTS

| | | |
|---|---|---|
| JP | 2008-130836 A | 6/2008 |
| KR | 10-2006-0135848 A | 12/2006 |
| KR | 10-2009-0102207 A | 9/2009 |
| KR | 10-2009-0104578 A | 10/2009 |
| KR | 10-2010-0029926 A | 3/2010 |
| KR | 20-2010-0007605 U1 | 7/2010 |
| WO | WO 02/091478 | 11/2002 |

OTHER PUBLICATIONS

Korean Notice of Allowance dated Jul. 22, 2011 issued in Application No. 10-2010-0028841.

U.S. Office Action issued in U.S. Appl. No. 13/075,527 dated Oct. 31, 2012.

U.S. Final Office Action issued in U.S. Appl. No. 13/075,527 dated Mar. 7, 2013.

U.S. Notice of Allowance issued in U.S. Appl. No. 13/075,527 dated May 3, 2013.

* cited by examiner

LIGHT EMITTING DEVICE HAVING CAVITY SIDE SURFACES WITH RECESSES

CROSS-REFERENCE TO RELATED APPLICATIONS

This application is a continuation of U.S. patent application Ser. No. 13/075,527 filed on Mar. 30, 2011, which claims priority under 35 U.S.C. §119 of Korean Patent Application No. 10-2010-0028840 and 10-2010-0028841 filed on Mar. 30, 2010, which is hereby incorporated by reference in its entirety.

BACKGROUND

Embodiments relate to a light emitting device and a light unit having the same.

In light emitting devices (LEDs), a P—N junction diode having the properties of converting electrical energy into light energy may be formed by combining group III and V elements on the periodic table. LEDs may implement various colors by controlling the composition ratio of compound semiconductors.

When a forward bias voltage is applied to the p-n junction diode, an electron of an N-layer is recombined with a hole of a P-layer to emit an energy corresponding to an energy gap between a conduction band and a valence band.

Since a nitride semiconductor that is a kind of materials forming the LEDs has high thermal stability and wide band gap energy, the nitride semiconductor has been an object of high interest in the field of developing optical devices and high power electronic devices. In particular, blue LED, green LED, UV LED, etc. using a nitride semiconductor have been commercialized and are being widely used.

SUMMARY

Embodiments provide a light emitting device having a new structure and a light unit using the same.

Embodiments provide a light emitting device having a second cavity periphery a first cavity to receive a molding member overflowing from the first cavity.

Embodiments provide a light emitting device in which a contact area between a molding member and a light guide plate may be reduced.

Embodiments provide a light emitting device may improve reliability of a light emitting device and a light unit including the same.

In one embodiment, a light emitting device includes: a body including a first cavity and a second cavity; first and second lead electrodes disposed within the first cavity; and a light emitting chip disposed within the first cavity, wherein the first cavity and the second cavity have an opening, and the second cavity is spaced apart from the first cavity, and wherein the second cavity has an upper width grater than a lower width thereof and an a side surface of the second cavity is fanned in a substantially vertical side surface with respect to a top surface of the body.

In another embodiment, a light emitting device includes: a body having a first cavity; at least one lead electrode disposed within the first cavity; a light emitting device disposed in the first cavity, the light emitting device being electrically connected to the lead electrode; a first molding member in the first cavity; and a second molding member periphery the first cavity of the body, wherein the second cavity has a depth less than about ⅕ of a depth of the first cavity from a top surface of the body.

In further another embodiment, a light unit includes: a board; a plurality of light emitting devices disposed on the board; and a light guide plate corresponding to the plurality of light emitting devices, wherein each of the light emitting devices includes: a body; a first cavity disposed at a center of the body, the first cavity having an opened upper side; a second cavity disposed periphery an upper portion of the body, the second cavity being spaced from the first cavity; first and second lead electrodes disposed within the first cavity; a light emitting chip disposed on at least one of the first and second lead electrodes; and a first molding member in the first cavity, wherein an inner side surface of the second cavity is disposed more close to the first cavity and is inclined in a direction of the first cavity with respect to a bottom surface of the second cavity.

The details of one or more embodiments are set forth in the accompanying drawings and the description below. Other features will be apparent from the description and drawings, and from the claims.

DETAILED DESCRIPTION OF THE EMBODIMENTS

Figure 1:
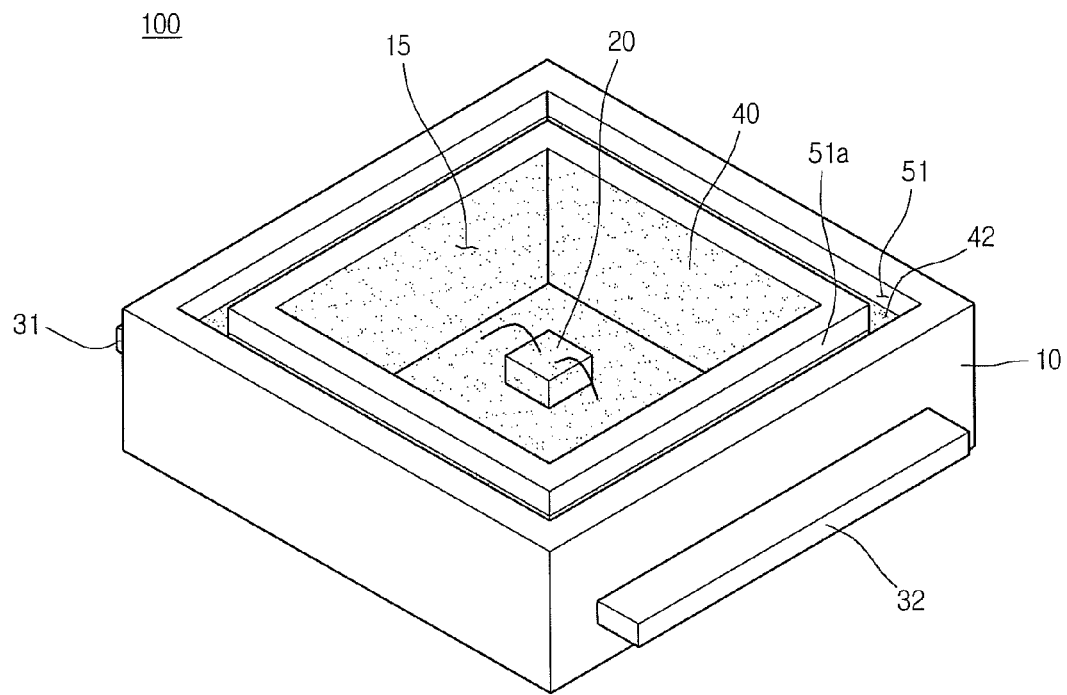
FIG. 1 is a perspective view of a light emitting device according to an embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device according to embodiments will be described with reference to the accompanying drawings.

Figure 2:
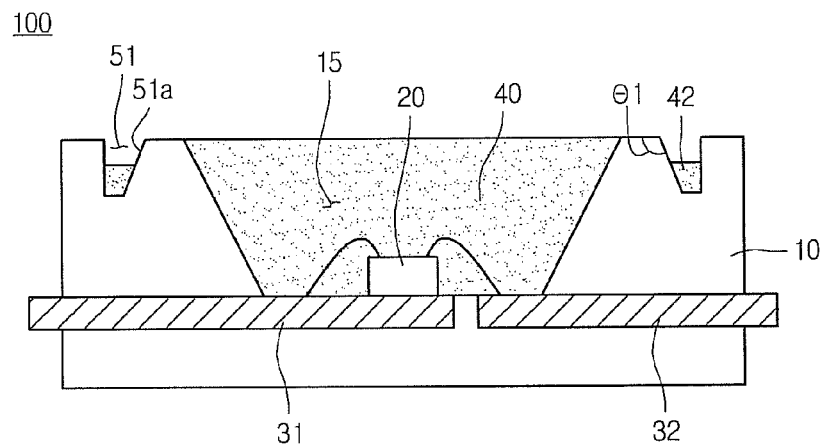
FIG. 2 is a side sectional view of the light emitting device of FIG. 1.

FIG. 1 is a perspective view of a light emitting device 100 according to an embodiment, and FIG. 2 is a side sectional view of the light emitting device 100 of FIG. 1.

Referring to FIGS. 1 and 2, the light emitting device 100 according to an embodiment may a body 10, a first cavity 15 defined in the body 10, a second cavity 51 disposed in the body 10 and periphery the first cavity 15, first and second lead electrodes 31 and 32 disposed within the body 10, a light emitting chip 20 disposed within the first cavity 15 to electrically connect the first lead electrode 31 to the second lead electrode 32, a first molding member 40 disposed in the first cavity 15, and a second molding member 42 disposed in the second cavity 51.

The second molding member 42 may have a top surface lower than that of the first molding member 40 with respect to a top surface of the body 10. Thus, since a portion of the first molding member 40 defines the second molding member 42, the top surface of the second molding member 42 may be further spaced from the top surface of the body 10 than the top surface of the first molding member 40.

The body 10 may be formed of at least one of a resin material such as polyphthalamide (PPA), silicon (Si), aluminum (Al), aluminum nitride (AlN), AlOx, photo sensitive glass (PSG), polyamide 9T (PA9T), syndiotactic polystyrene (SPS), a metal material, sappahire ($Al_2O_3$), beryllium oxide (BeO), and a printed circuit board (PCB). The body 10 may be manufactured by an injection molding or etching process, but is not limited thereto.

When the body 10 is formed of a material having thermal conductivity, an insulation layer (not shown) may be disposed on a surface of the body 10 to prevent the body 10 from being electrically shorted with the first and second electrodes 31 and 32.

When the body 10 is formed of silicon (Si), a protection device such as a zener diode may be formed in an integrated circuit form through a method in which a conductive dopant is injected into the body 10. Also, when the body 10 is formed of silicon, the body 10 may have an inclined outer side surface.

The first and second cavities 15 and 51 may be defined in the body 10 to open an upper side of the body 10.

For example, the first and second cavities 15 and 51 may be formed while the body 10 is injection-molded or may be separately formed by an etching process, but is not limited thereto.

The light emitting chip 20 may be disposed in the first cavity 15. An upper region of the first cavity 15 serves as a light emission surface through which light emitted from the light emitting chip 20 is emitted to the outside.

The first cavity 15 may have a cup shape or a concave container shape. The first cavity 15 may have a vertical or inclined inner side surface with respect to a bottom surface thereof. Also, the first cavity 15 may have a top surface having a circular shape, a square shape, a polygonal shape, or an oval shape when viewed from an upper side.

The second cavity 51 may be disposed around the first cavity 15 and spaced from the first cavity 15. The second cavity 51 may have a depth of less than about ⅕ of a depth of the first cavity 15 from a top surface of the body 10. Alternatively, the second cavity 51 may have a depth of less than about ⅕ of a thickness of the body 10 from the top surface of the body 10.

For example, as shown in FIG. 1, the second cavity 51 may have a closed curve shape to surround a circumference of the first cavity 15, but is not limited thereto.

The second molding member 42 overflowing when the first molding member 40 is filled into the first cavity 15 may be filled into the second cavity 51.

That is, since the light emitting device according to an embodiment has the second cavity 51, the first molding member 40 may have a top surface which is substantially flush with the uppermost surface of the body 10. Also, defects occurring due to the overflowing of the molding member 40 may be minimized to improve reliability. Specifically, the structure including the second cavity 51 may be very effective when the first molding member 40 is formed of a material having low viscosity.

The second cavity 51 may be defined so that an inner side surface 51a adjacent to the first cavity 15 is inclined with respect to the bottom surface thereof. The inner side surface may be inclined at an angle θ1 of about 90° to about 170° with respect to the top surface of the body 10. The inclined angle may be optimized according to the viscosity of the molding member 40. When the inner side surface 51a is inclined, the overflowing molding member may be easily introduced into the second cavity 51. The inner side surface 51a of the second cavity 51 is disposed more close to the first cavity 15 to reduce an amount of molding member remaining in a region between the first cavity 15 and the second cavity 51. An other side surface of the second cavity 51 facing the inner side surface may be substantially vertically disposed with respect to the bottom surface of the first cavity 15 or has at an angle of about 90° to about 100° with respect to the bottom surface of the first cavity 15.

The top surface of the body 10 disposed between the first cavity 15 and the second cavity 51 may be disposed flush with the top surface of the body 10 disposed outside the second cavity 51.

The first and second lead electrodes 31 and 32 may be disposed on the body 10 and electrically separated from each other. The first and second lead electrodes 31 and 32 may be electrically connected to the light emitting chip 20 to provide a power into the light emitting chip 20.

The first and second lead electrodes 31 and 32 may have one ends disposed within the first cavity 15 of the body 10 and the other ends exposed to the outside or a lower surface of the body 10 along a surface of the body 10. Alternatively, the first and second lead electrodes 31 and 32 may pass through the top and lower surfaces of the body 10 to define a lower surface of the light emitting device 100. However, the present disclosure is not limited to the structure of the first and second lead electrodes 31 and 32.

The first and second lead electrodes 31 and 32 may be selectively manufactured using a plating process, a deposition process, or a photolithography process, but is not limited thereto.

The first and second lead electrodes 31 and 32 may be formed of a metal material having conductivity, e.g., at least one material or alloy of Ti, Cu, Ni, Au, Cr, Ta, Pt, Sn, Ag, P, Al, In, Pd, Co, Si, Ge, Hf, Ru, and Fe. Also, each of the first and second lead electrodes 31 and 32 may have a single- or multi-layer structure, but is not limited thereto.

The light emitting chip 20 may be disposed in the first cavity 15 of the body 10. Specifically, the light emitting chip 20 may be disposed on a bottom surface of the first cavity 15 or disposed on any one of the first and second lead electrodes 31 and 32.

For example, the light emitting chip 20 may be a light emitting diode (LED), but is not limited thereto.

When the light emitting chip 20 is the LED, the LED may be at least one of a colored light emitting diode which emits light having a red, green, or blue color, a white light emitting diode which emits light having a white color, and an ultraviolet (UV) light emitting diode, but it not limited thereto.

The light emitting chip 20 may be formed of a group III-V compound semiconductor layer, e.g., GaN, AlN, AlGaN, InGaN, InN, InAlGaN, AlInN, AlGaAs, GaP, GaAs, GaAsP, or AlGaInP-based semiconductor material to emit light having proper colors of the semiconductor materials.

As shown in FIGS. 1 and 2, the light emitting chip 20 may be electrically connected to the first and second lead electrodes 31 and 32 through a wiring process. Alternatively, the light emitting chip 20 may be electrically connected to the first and second lead electrodes 31 and 32 through a chip bonding process or a flip-chip process, but is not limited thereto.

The first molding member 40 may be disposed in the first cavity 15, and the second molding member 42 may be disposed in the second cavity 51.

The first and second molding members 40 and 42 may be formed of the same material as each other. For example, each of the first and second molding members 40 and 42 may be formed of a light-transmitting silicon or resin material, but is not limited thereto.

The first molding member 40 may seal and protect the light emitting chip 20. A top surface of the first molding member 40 serves as a light emission surface through which light emitted from the light emitting chip 20 is emitted to the outside.

The first molding member 40 may have a flat top surface. Also, the first molding member 40 may have the top surface which is substantially flush with the uppermost surface of the body 10.

The second molding member 42 may be disposed in the second cavity 51. Also, the second molding member may fill a portion of the second cavity 51 or the entire second cavity 51.

FIGS. 3 to 6 are views illustrating a process of manufacturing the first and second molding members 40 and 42 of the light emitting device 100 according to an embodiment. Hereinafter, the process of manufacturing the first and second molding members 40 and 42 will be described in detail with reference to FIGS. 3 to 6.

Figure 3:
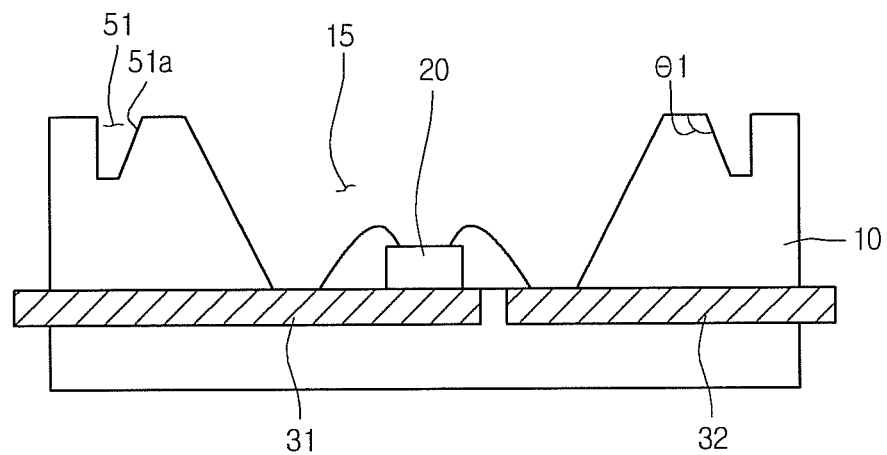
FIGS. 3 to 6 are views illustrating a process of manufacturing first and second molding members of a light emitting device according to an embodiment.

Referring to FIG. 3, the body 10 having the first and second cavities 15 and 51 is prepared. The first and second cavities 15 and 51 may be formed in the body 10 through an injection molding or etching process, but is not limited thereto.

Figure 4:
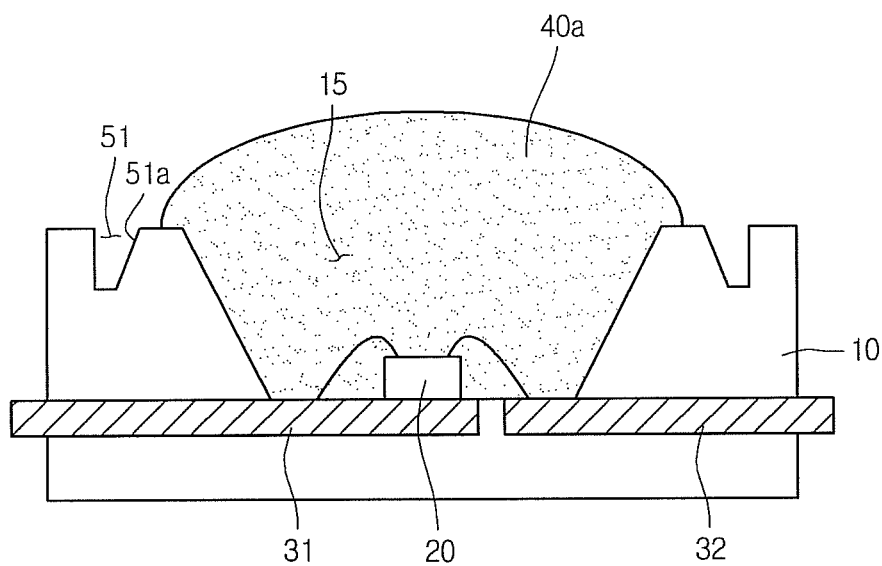

Referring to FIG. 4, a material 40a forming the first and second molding members 40 and 42, e.g., a silicon or resin material may be introduced into the first cavity 15 using a dispensing apparatus.

Figure 5:
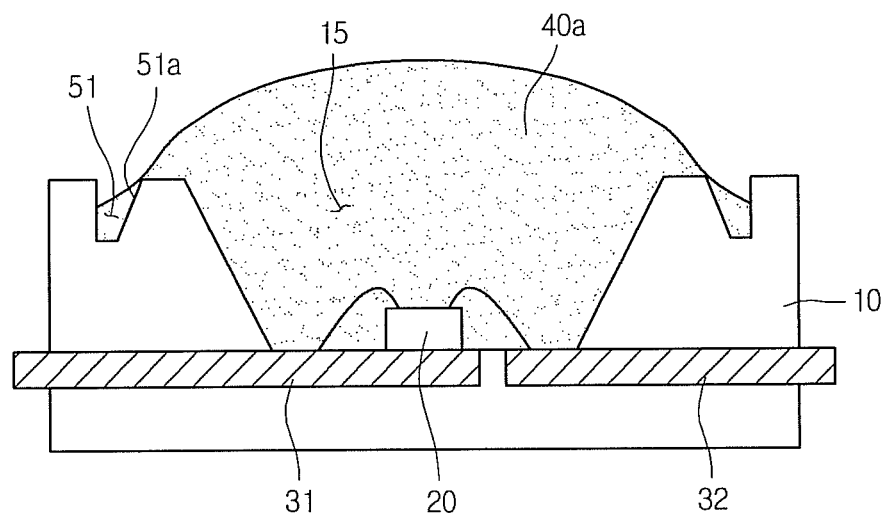

Referring to FIG. 5, when the material 40a forming the first and second molding members 40 and 42 has low viscosity, a portion of the material 40a may flow outside the first cavity 15 and thus be introduced into the second cavity 51. Specifically, since some silicon or resin materials have low viscosity at a temperature of about 30° C. to about 100° C., the materials may not cohere in an upper region of the first cavity 15, but overflow outside the first cavity 15.

Figure 6:
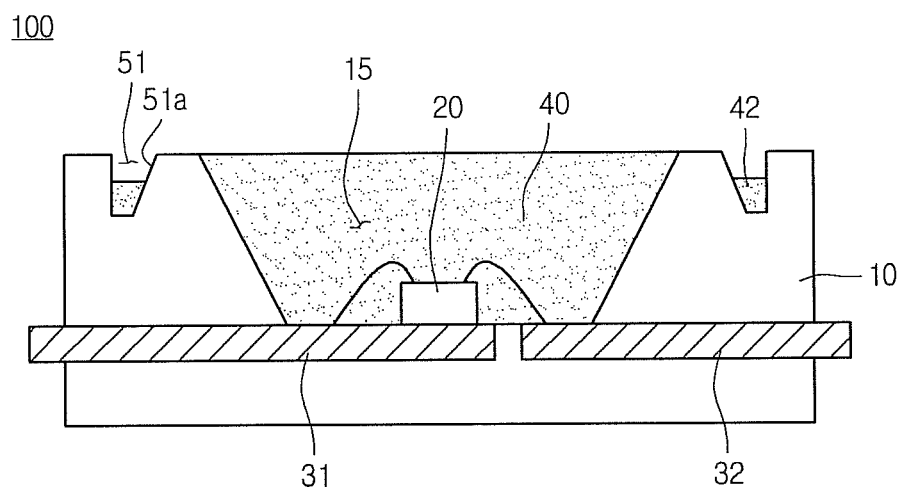

Referring to FIG. 6, the material 40a may flow outside the first cavity 15 until the top surface of the first molding member 40 becomes flat so that the top surface of the first molding member 40 is flush with the uppermost surface of the body 10. Then, when a curing process is performed after the top surface of the first molding member 40 becomes flat, the light emitting device 100 according to an embodiment may be provided.

A phosphor may be added to the first molding member 40. The light emitted from the light emitting chip 20 may be changed in wavelength by the phosphor.

For example, when the light emitting chip 20 is a blue light emitting diode emitting blue light and the phosphor is a yellow phosphor emitting yellow excitation light, the light emitting device 100 may emit white light in which the blue light emitted from the light emitting chip 20 and the yellow light emitted by exciting the yellow phosphor by the blue light are mixed with each other.

Figure 7:
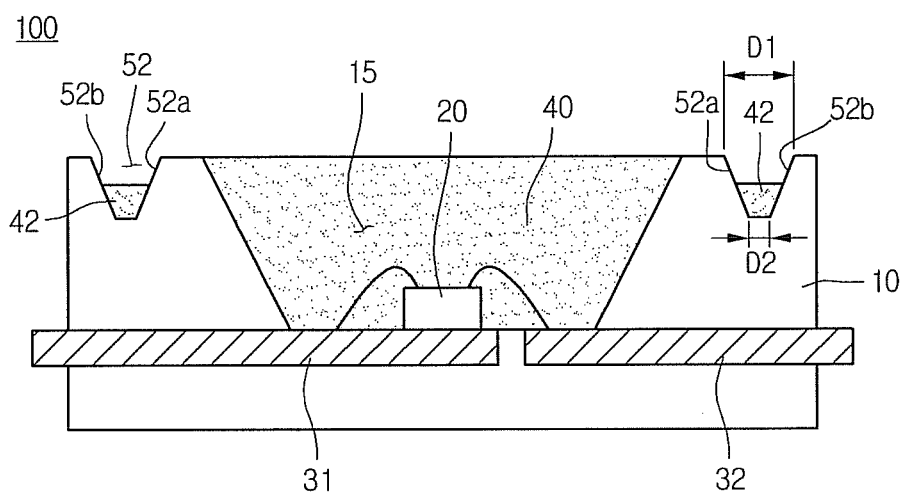
FIG. 7 is a side sectional view of a light emitting device according to a second embodiment.

FIG. 7 is a side sectional view of a light emitting device according to a second embodiment.

Referring to FIG. 7, a light emitting device 100 has a structure in which both inner side surfaces 52a and 52b of a second cavity 52 are inclined. Both inner side surfaces 52a and 52b of the second cavity 52 may have a symmetrical structure. Alternatively, at least one side surface of the second cavity 52 may be substantially vertically disposed with respect to the bottom surface of the first cavity 15 or inclined with respect to a vertical axis.

The second cavity 52 may have an upper width D1 greater than a lower width D2.

Figure 8:
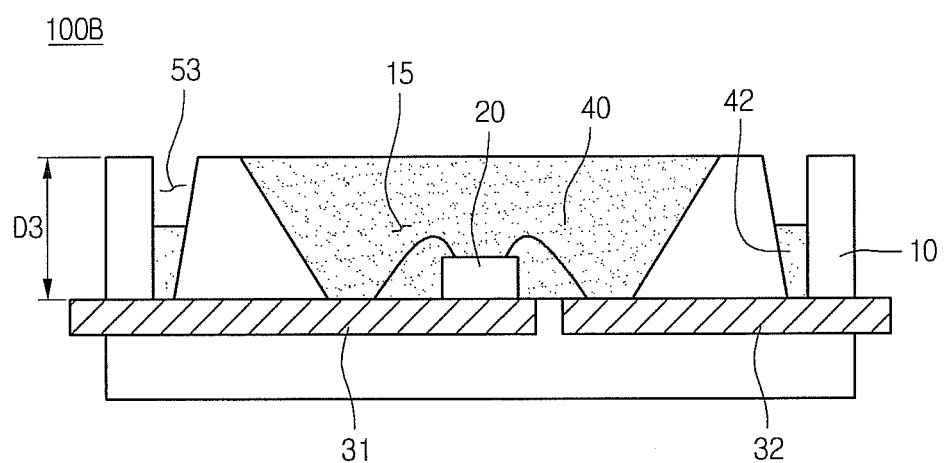
FIG. 8 is a side sectional view of a light emitting device according to a third embodiment.

FIG. 8 is a side sectional view of a light emitting device 100B according to a third embodiment.

Referring to FIG. 8, the light emitting device 100B is equal to the light emitting device 100 of FIG. 1 except a depth of a second cavity 53. Like the light emitting device 100 of FIG. 1, the second cavity 53 may be shallow than a first cavity 15. Alternatively, like the light emitting device 100B, the first and second cavities 15 and 53 may have the same depth D3 as each other from the top surface of the body 10. That is, the depth of the second cavity 53 may be changed according to materials of first and second molding members 40 and 42 and a method of manufacturing the light emitting device.

Figure 9:
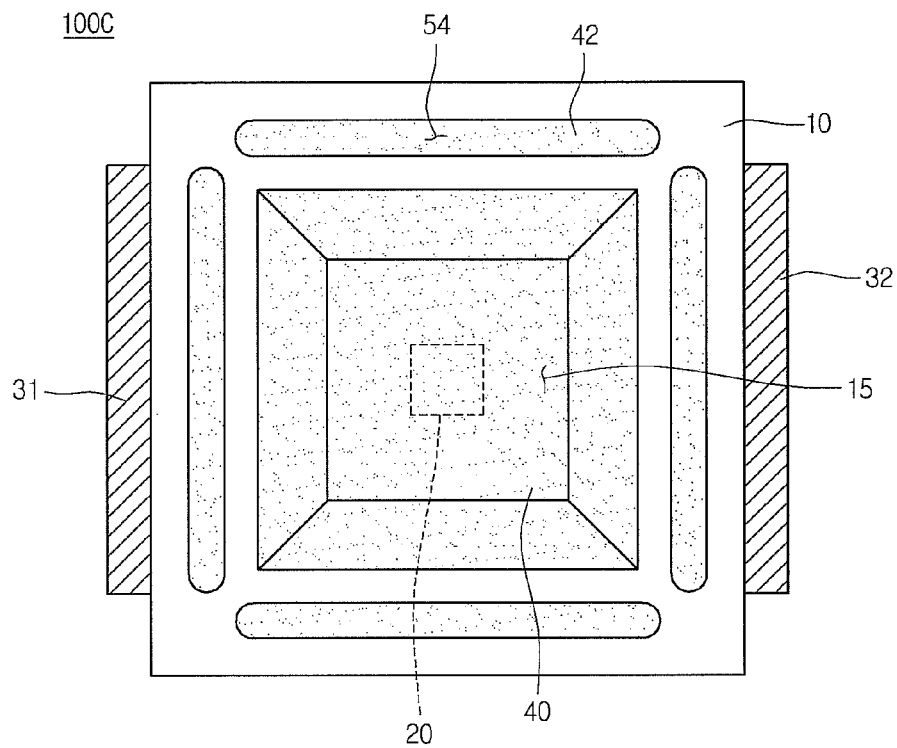
FIG. 9 is a top view of a light emitting device according to a fourth embodiment.

FIG. 9 is a top view of a light emitting device 100C according to a fourth embodiment.

Referring to FIG. 9, a second cavity 54 may be partially disposed periphery a first cavity 15.

That is, the second cavity 54 may not be disposed along a closed curve as shown in the light emitting device 100 of FIG.

1, but be partially disposed as shown in the light emitting device 100C of FIG. 7. This structure may be changed according to a design of the light emitting device. Each of the second cavities 54 is formed in a line shape or a bar shape disposed outside the first cavity 15.

Figure 10:
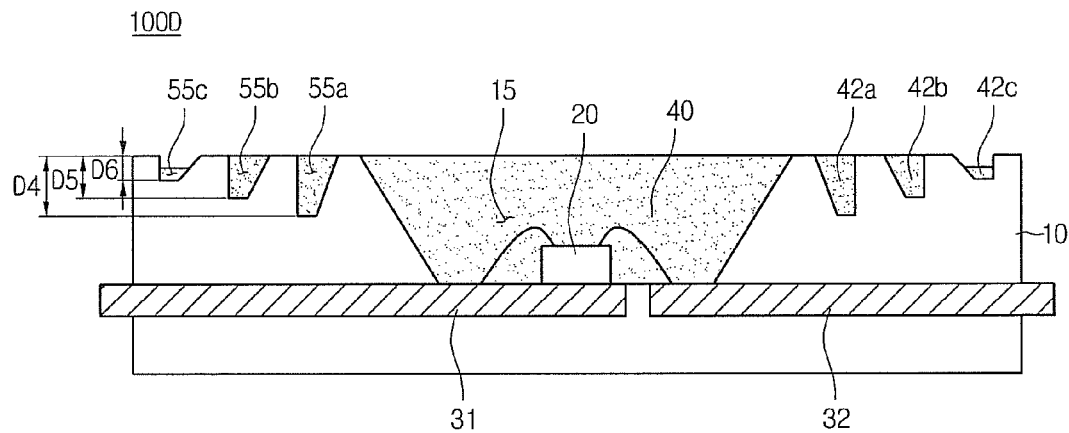
FIG. 10 is a side sectional view of a light emitting device according to a fifth embodiment.

FIG. 10 is a side sectional view of a light emitting device 100D according to a fifth embodiment.

Referring to FIG. 10, a plurality of cavities 55a, 55b, and 55c may be defined outside a first cavity 15.

For example, as shown in FIG. 10, a second cavity 55a, a third cavity 55b, and a fourth cavity 55c may be sequentially defined outside the first cavity 15.

The second, third, and fourth cavities 55a, 55b, and 55c may have the same depth D4, D5, or D6 as each other or depths D4, D5, and D6 different from each other. For example, the second, third, and fourth cavities 55a, 55b, and 55c have the depths D4, D5, and D6 which become gradually shallow. That is, the more the depths D4, D5, and D6 of the second, third, and fourth cavities 55a, 55b, and 55c become shallow, the more the second, third, and fourth cavities 55a, 55b, and 55c are away from the first cavity 15. Also, second molding members 42a, 42b, and 42c may be fully or partially filled into the second, third, and fourth cavities 55a, 55b, and 55c or may not be filled into the second, third, and fourth cavities 55a, 55b, and 55c, but is not limited thereto.

The second cavity 55a adjacent to the first cavity 15 among the second, third, and fourth cavities 55a, 55b, and 55c has a depth deeper than that of the third cavity 55c disposed in a sidewall of the body 10. The third cavity 55c is disposed more close to a side surface of the body 10 than the second cavity 55a. Each of the inner side surfaces of the second, third, and fourth cavities 55a, 55b, and 55c may be inclined at an angle of about 90° to about 170° with respect to the top surface of the body 10. The inclined angle of the inner side surfaces of the second, third, and fourth cavities 55a, 55b, and 55c may be differ from each other.

Figure 11:
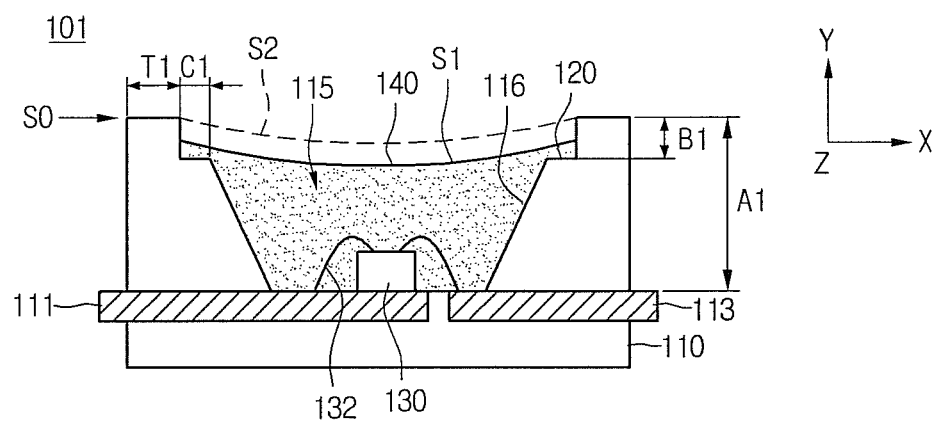
FIG. 11 is a sectional view of a light emitting device according to a sixth embodiment.

FIG. 11 is a sectional view of a light emitting device according to a sixth embodiment.

Referring to FIG. 11, a light emitting device 101 includes a body 110 having a first cavity 115, a light emitting chip 130 within the first cavity 115, a plurality of lead electrodes 111 and 113 within the first cavity 115, a molding member 140 within the first cavity 115, and a second cavity 120 around the first cavity 115 of the body 110.

For example, the body 110 may be formed of one of a resin material such as PPA, a ceramic material, liquid crystal polymer (LCP), syndiotactic (SPS), poly(phenylene ether) (PPS), and a silicon material. However, the present disclosure is not limited to the material of the body 110. The body 110 may be integrally formed by injection molding or have a structure in which a plurality of layers are stacked. The body 110 may be classified into a reflective part having the first cavity 115 on the lead electrodes 111 and 113 and a support part under the lead electrodes 111 and 113, but is not limited thereto.

The body 110 has the first cavity 115 having an opened upper side at an upper portion thereof. The first cavity 115 may be formed by performing a patterning, punching, cutting, or etching process on the body 110. Alternatively, the first cavity 115 may be formed by a metal framework molded in a shape equal to that of the first cavity 115 when the body 110 is molded.

The first cavity 115 may have a cup shape or a container shape. Also, an outer shape of the first cavity 115 may have a circular shape, a polygonal shape, or a random shape, but is not limited thereto.

The first cavity 115 may have a vertical or inclined side surface 116 with respect to a bottom surface of the first cavity 115 in consideration of an illumination angle of the light emitting chip 130. Hereinafter, embodiments will describe the first cavity 115 having the inclined side surface 116 as an example.

A material having a high reflection effect, e.g., photo solder resist (PSR) ink having a white color, silver (Ag), or aluminum (Al) may be coated on the side surface 116 of the first cavity 115. Thus, light emission efficiency of the light emitting chip 130 may be improved.

A depth A1 of the first cavity 115 represents a distance from top surfaces of the lead electrodes 111 and 113 to a top surface of the body 110. For example, the first cavity 115 may have a depth of about 150 μm to about 370 μm. The lead electrodes 111 and 113 may be realized by a lead frame, but is not limited thereto.

The second cavity 120 is defined in an inner circumference of the body 110. The second cavity 120 is defined inside the body 110 and around the first cavity 115. The second cavity 120 has a structure which is stepped from the first cavity 115 on the top surface of the body 110.

The plurality of lead electrodes 111 and 113 are disposed within the body 110. The plurality of lead electrodes 111 and 113 may be electrically separated from the bottom surface of the first cavity 115. Outer side parts of the plurality of lead electrodes 111 and 113 may be exposed to the outside of the body 110.

The plurality of lead electrodes 111 and 113 may have ends disposed on a side surface of the first cavity 115 or on a side opposite to that of the first cavity 115.

The plurality of lead electrodes 111 and 113 may be formed of a lead frame. The lead frame may be formed when the body 110 is injection-molded.

The light emitting chip 130 may be attached to the first lead electrode 111 of the plurality of lead electrodes 111 and 113. The light emitting chip 130 includes at least one LED chip. A colored LED chip or an UV LED chip may be used as the LED chip.

The light emitting chip 130 may be electrically connected to the plurality of lead electrodes 111 and 113 using a plurality of wires 132. Alternatively, the light emitting chip 130 may be electrically connected to the plurality of lead electrodes 111 and 113 by selectively using a wire bonding, die bonding, or flip-chip bonding process, but is not limited thereto.

A molding member 140 is disposed in the first cavity 115. The molding member 140 may be formed of a material such as silicon or epoxy or a material having a reflective index of less than about 2. At least one kind of phosphor or diffuser may be added to the molding member 140, but is not limited thereto.

The molding member 140 may be dispensed by a dispenser and molded into the first cavity 115. Then, the molding member 140 may be thermally treated at a predetermined temperature and cured. Here, due to a volume of the first cavity 115 and errors due to the dispenser, the molding member 140 may have a thickness error of about ±30 μm. When an amount of dispensed molding member 140 is large, the molding member 140 may have a surface having a concave lens shape. The surface having the concave lens shape may contact a light-incident part of a light guide plate. When the light-incident part of the light guide plate contacts the surface of the molding member 140, optical losses (e.g., optical losses of a short wavelength) may occur around the light-incident part of the light guide plate due to a thermal expansion coefficient difference between the light guide plate and the molding member 140 on an interface therebetween.

The second cavity 120 is connected to the first cavity 115 of the body 110. Also, the second cavity 120 provides a space in which the molding member 140 overflowing from the first cavity 115 is received. The second cavity 120 may have a stepped structure enough to receive an amount of molding member 140 within an error range. The second cavity 120 may have a recessed structure, a groove structure, or a concave structure.

The second cavity 120 extends around an upper portion of the first cavity 115. The second cavity 120 has a bottom surface parallel to that of the first cavity 115 and a vertical sidewall till a top surface thereof with respect to the bottom surface of the first cavity 115. The bottom surface of the second cavity 120 may have a structure stepped from an upper end of the first cavity and a predetermined width C1. The width C1 may be above about 0.05 mm. Also, the width C1 may be changed according to a size of a package.

A depth B1 of the second cavity 120 represents a distance between the top surface and the lower surface of the body 110. The second cavity 120 may have the depth B1 less than about ⅕ of a thickness (or height) of the body 110 or equal to about ⅕ of the depth A1 of the first cavity 115.

The second cavity 120 may be defined in at least one region between the upper portion of the first cavity 115 and the body 110.

The top surface of the body 110 may have a width T1 equal to or less than that C1 of the second cavity 120, but is not limited thereto.

When a large amount of molding member 140 is supplied into the first cavity 115, a portion of the molding member 140 may be disposed in the second cavity 120. That is, the molding member 140 is primarily filled into the first cavity 115, and then, filled into the second cavity 120.

The second cavity 120 may buffer the excessively supplied molding member 140. Thus, the molding member 140 may have a surface having a concave lens shape. The second cavity 120 may prevent a surface S1 of the molding member 140 from protruding in a convex lens shape with respect to an extending line S0 of the package.

Figure 12:
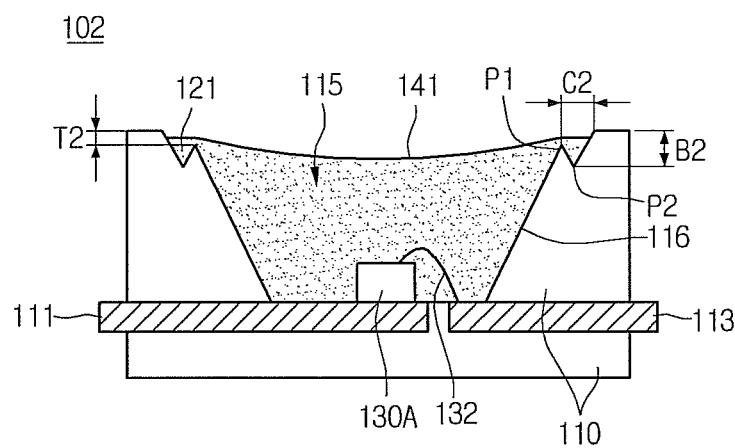
FIG. 12 is a sectional view of a light emitting device according to a seventh embodiment.

FIG. 12 is a sectional view of a light emitting device according to a seventh embodiment. A portion of components to be described in the seventh embodiment will be described with reference to the sixth embodiment.

Referring to FIG. 12, a light emitting device 102 has a second cavity 121 having a triangular shape. The second cavity 121 is connected to an upper end P1 of a side surface of a first cavity 115. The second cavity 121 may have a depth greater than that of the upper end P1 of the side surface of the first cavity 115. A lower portion of the second cavity 121 may have a predetermined depth B2 with respect to a top surface of a body 110. The depth B2 may be about ⅕ of a depth A1 of the first cavity 115.

A portion of a molding member 141 may be disposed in the second cavity 121. Thus, the molding member 141 of the first cavity 115 may be defined as a first molding member, and the molding member disposed in the second cavity 121 may be defined as a second molding member.

Also, the upper end P1 of the first cavity 115 may be spaced a predetermined distance T2 from the top surface of the body 110. A portion of the molding member 141 overflowing from the first cavity 115 may be filled into the second cavity 121. The second cavity 121 may have a width C2 changed by the depth B2 and a side surface thereof, but is not limited thereto.

A light emitting chip 130A may be mounted on a first lead electrode 111, and the light emitting chip 130A may be connected to a second lead electrode 113 by a wire 132.

Figure 13:
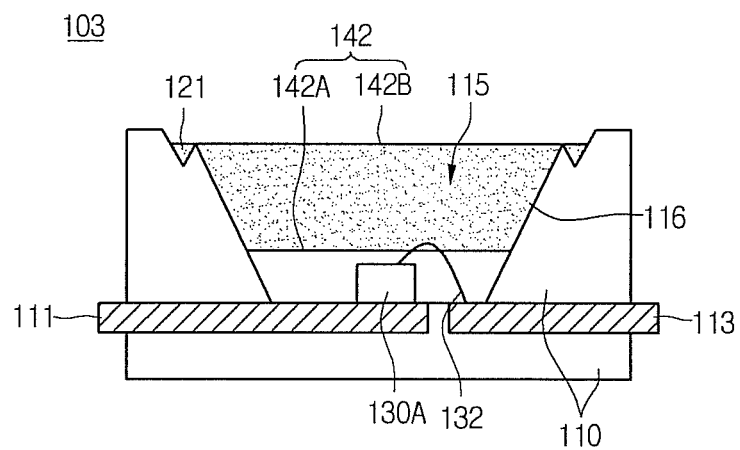
FIG. 13 is a sectional view of a light emitting device according to an eighth embodiment.

FIG. 13 is a sectional view of a light emitting device according to an eighth embodiment. A portion of components to be described in the eighth embodiment will be described with reference to the foregoing embodiments.

Referring to FIG. 13, a light emitting device 103 has a first cavity 115. A molding member 142 is disposed in the first cavity 115. The molding member 142 includes a first resin layer 142A at a lower portion thereof and a second resin layer 142B at an upper portion thereof. The first resin layer 142A may be a transparent resin layer, and the second resin layer 142B may be a transparent resin layer to which a phosphor is added. In the current embodiment, the phosphor may be added to the second resin layer 142B to emit mixed light of light emitted from a light emitting chip 130A and light emitted from the phosphor.

The first resin layer 142A may have a top surface disposed at a position lower than the highest point of the wire 132 connected to the light emitting chip 130A. Since most of the wire 132 is fixed by the first resin layer 142A, it may prevent the wire 132 from being moved and prevent a bonded portion of the wire 132 from being separated when the second resin layer 142B is formed.

Figure 14:
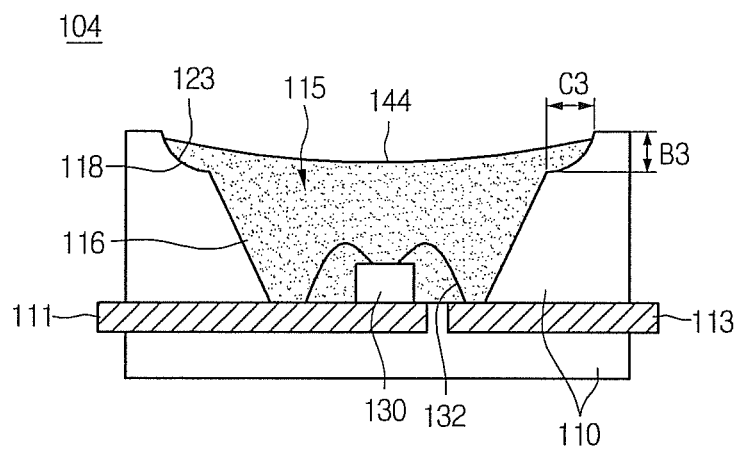
FIG. 14 is a sectional view of a light emitting device according to a ninth embodiment.

FIG. 14 is a sectional view of a light emitting device according to a ninth embodiment. A ninth embodiment will be described with reference to the foregoing embodiments.

Referring to FIG. 14, a light emitting device 104 has a second cavity 123 with a side surface 118 having a predetermined curvature. The second cavity 123 may extend with a smoothly curved surface 118 from an upper end of a side surface of a first cavity 115 up to a top surface of a body 110. A molding member 144 is disposed in the first cavity 115 and second cavity 123.

Figure 15:
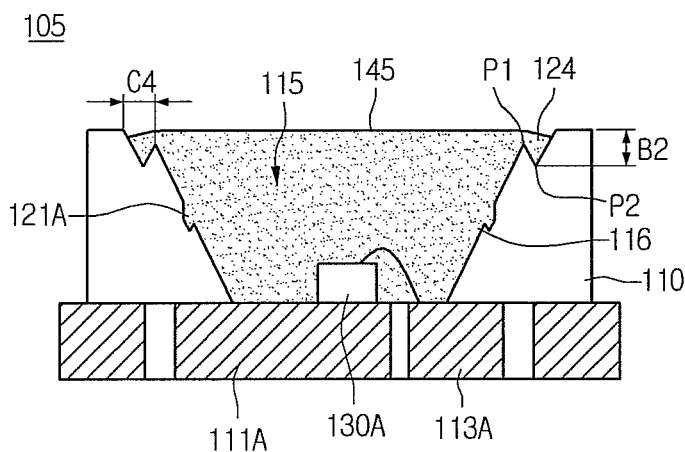
FIG. 15 is a sectional view of a light emitting device according to a tenth embodiment.

FIG. 15 is a sectional view of a light emitting device according to a tenth embodiment. A tenth embodiment will be described with reference to the foregoing embodiments.

Referring to FIG. 15, a light emitting device 105 has a concave part 121A in a lower portion of a side surface of a first cavity 115 and a second cavity 124 around the first cavity 115.

The concave part 121A may increases a volume of a molding member 145 filled into the first cavity 115. The second cavity 124 is defined periphery an upper portion of the first cavity 115. The molding member 145 molded in the first cavity 115 may be filled in the concave part 121A, and a portion of the molding member 145 may be received into the second cavity 124 by overflowing over an upper end of the first cavity 115.

Here, the second cavity 124 may have a height B2 and width C4 changed according to a size of the concave part 121A, but is not limited thereto.

The body 110 may be embedded within a plurality of lead electrodes 111A and 113A. The plurality of lead electrodes 111A and 113A may have bottom surfaces disposed on the same line as that of the body 110. A light emitting chip 130A may be mounted on a top surface of the first lead electrode 111A. Also, the lower surface of the first lead electrode 111A may become a lower surface of the light emitting device 105. Thus, heat generated from the light emitting chip 130A may be effectively emitted through the first lead electrode 111A and the second lead electrode 113A.

Figure 16:
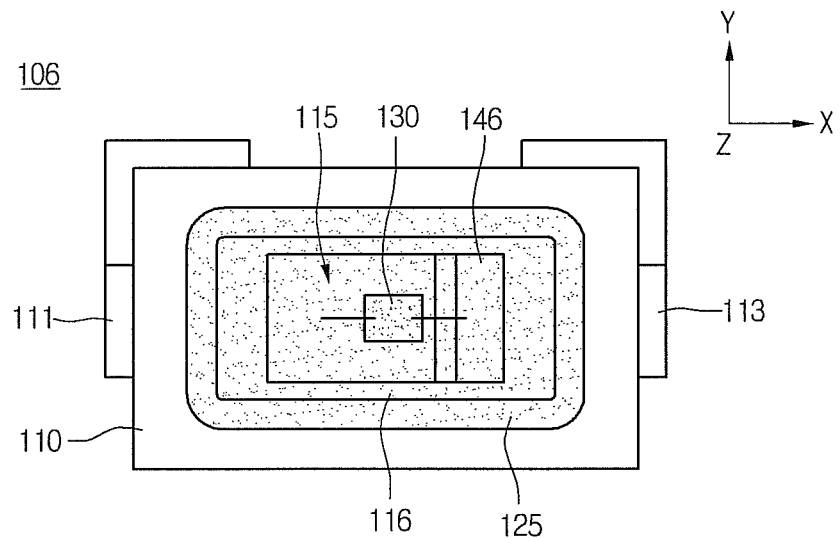
FIG. 16 is a plan view of a light emitting device according to an eleventh embodiment.

FIG. 16 is a plan view of a light emitting device according to an eleventh embodiment. An eleventh embodiment will be described with reference to the foregoing embodiments.

Referring to FIG. 16, a light emitting device 106 has a first cavity 115 disposed within a body 110 and a second cavity 125 disposed around the first cavity 115. The second cavity 125 extends from the first cavity 115 toward the outside of the body 110. The second cavity 125 has a loop shape, a ring shape, or a band shape. The loop shape may include a closed loop shape or an opened loop shape. A ring shape of the second cavity 125 may include an oval shape or a polygonal shape. A molding member 146 is disposed in the first cavity 115 and the second cavity 125.

Figure 17:
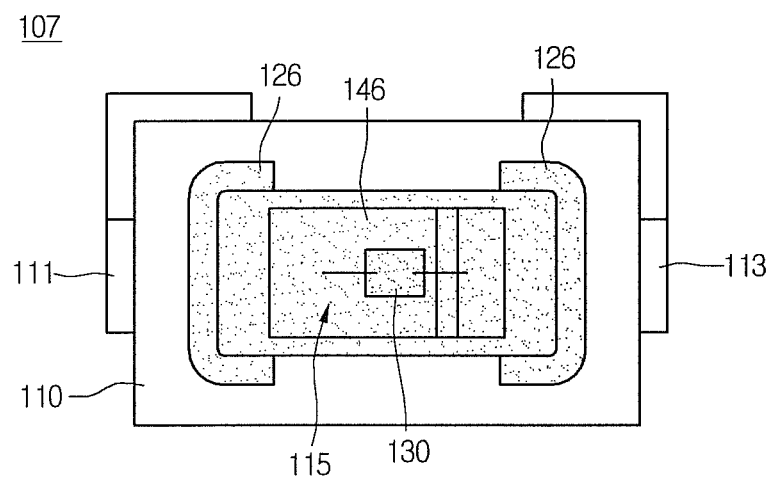
FIG. 17 is a plan view of a light emitting device according to a twelfth embodiment.

FIG. 17 is a plan view of a light emitting device according to a twelfth embodiment. A twelfth embodiment will be described with reference to the foregoing embodiments.

Referring to FIG. 17, a light emitting device 107 has a first cavity has a first cavity 115 disposed within a body 110 and a plurality of second cavities 126 disposed around the first cavity 115. The plurality of second cavities 126 may face both sides of the first cavity 115 and surround both sides of the first cavity 115. The second cavity 126 may have a uniform width or an irregular width, but is not limited thereto. The second cavity 126 may change a critical angle of light in the light emitting device 107. A molding member 146 is disposed in the first cavity 115 and the second cavities 126.

Figure 18:
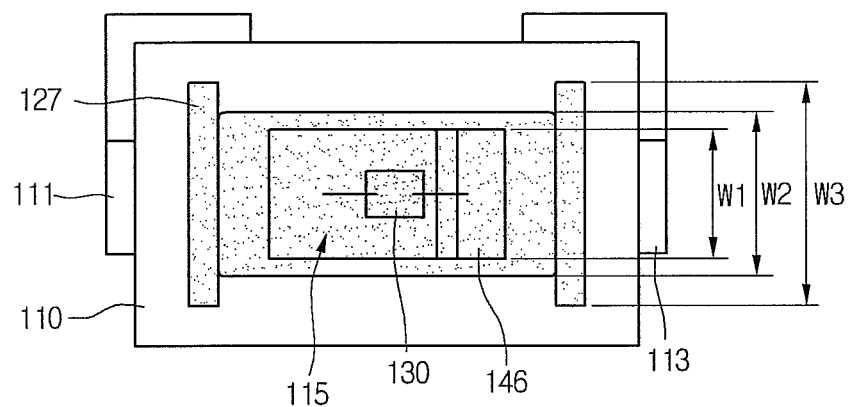
FIG. 18 is a plan view of a light emitting device according to a thirteenth embodiment.

FIG. 18 is a plan view of a light emitting device according to a thirteenth embodiment. A thirteenth embodiment will be described with reference to the foregoing embodiments.

Referring to FIG. 18, a light emitting device 108 has a first cavity 115 and second cavities disposed in both sides of the first cavity 115. The second cavities 127 may be disposed in both sides of the first cavity 115. Also, each of the second cavities 127 may have a length W3 greater or less than a width W1 of a bottom surface of the first cavity 115 or a width W2 of an upper end of the first cavity 115. A molding member 146 is disposed in the first cavity 115 and the second cavities 127.

Figure 19:
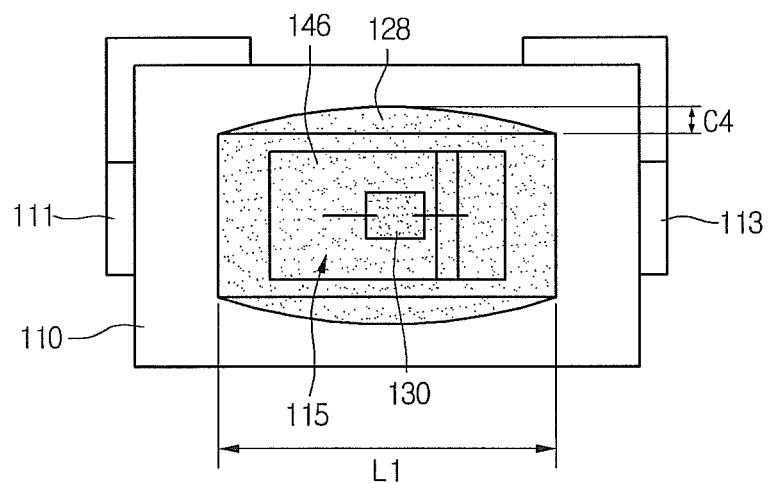
FIG. 19 is a plan view of a light emitting device according to a fourteenth embodiment.

FIG. 19 is a plan view of a light emitting device according to a fourteenth embodiment. A fourteenth embodiment will be described with reference to the foregoing embodiments.

Referring to FIG. 19, a light emitting device 109 has a first cavity 115 and second cavities 128 disposed in both sides of the first cavity 115. Each of the second cavities 128 is disposed along a length (L1) direction (a horizontal direction) of the first cavity 115. Also, each of the second cavities 128 may have a semicircular shape or a half-oval shape. Each of the second cavities 128 may have a maximum width C4 changed according to the length L1 of the first cavity 115. A molding member 146 is disposed in the first cavity 115 and the second cavities 148.

Figure 20:
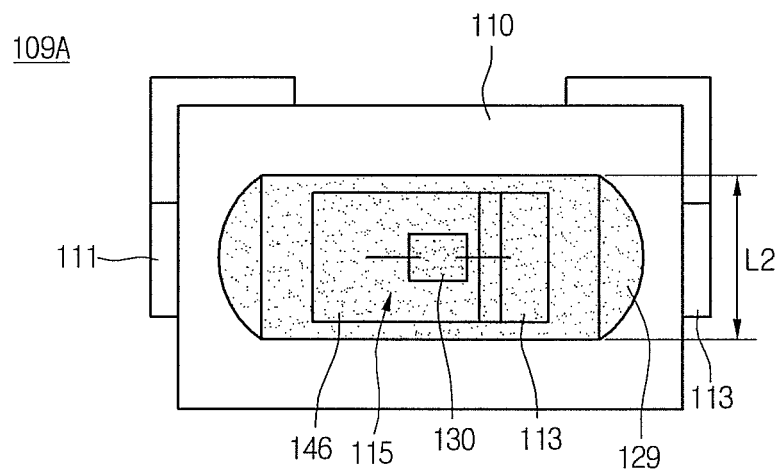
FIG. 20 is a plan view of a light emitting device according to a fifteenth embodiment.

FIG. 20 is a plan view of a light emitting device according to a fifteenth embodiment. A fifteenth embodiment will be described with reference to the foregoing embodiments.

Referring to FIG. 20, a light emitting device 109A has a first cavity 115 and second cavities 129 disposed in both sides of the first cavity 115. Each of the second cavities 129 is disposed along a width (L2) direction (a vertical direction) of the first cavity 115. Also, each of the second cavities 129 may have a semicircular shape or a half-oval shape. A molding member 146 is disposed in the first cavity 115 and the second cavity 129.

Figure 21:
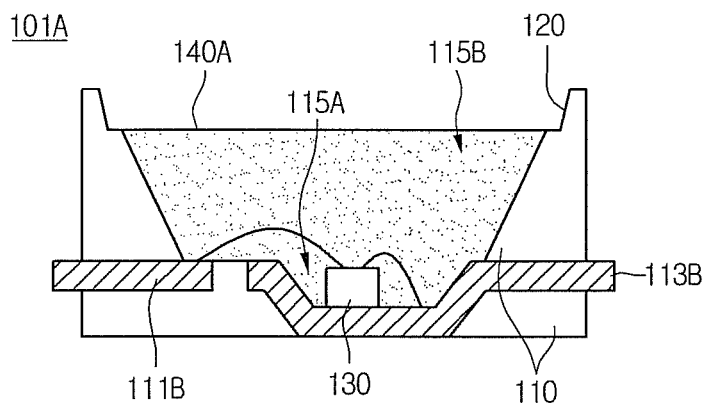
FIG. 21 is a sectional view of a light emitting device according to a sixteenth embodiment.

FIG. 21 is a sectional view of a light emitting device according to a sixteenth embodiment. A sixteenth embodiment will be described with reference to the foregoing embodiments.

Referring to FIG. 21, a light emitting device 101A has first cavities 115A and 115B having a multi-layered structure. The first cavities 115A and 115B having the multi-layered structure include a first lower cavity 115A and a first upper cavity 115B. The first lower cavity 115A may be realized by a second lead electrode 113B disposed on a body 110. The first upper cavity 115B is disposed on the first lower cavity 115A. A second cavity 120 may be disposed around the first upper cavity 115B. A molding member 140A is disposed in the first cavity 115. A portion of the molding member 140A may be disposed in the second cavity 120.

A lower surface of the second lead electrode 113B may become a lower surface of the light emitting device 101A. Thus, heat generated from a light emitting chip 130 may be effectively emitted to the outside.

Figure 22:
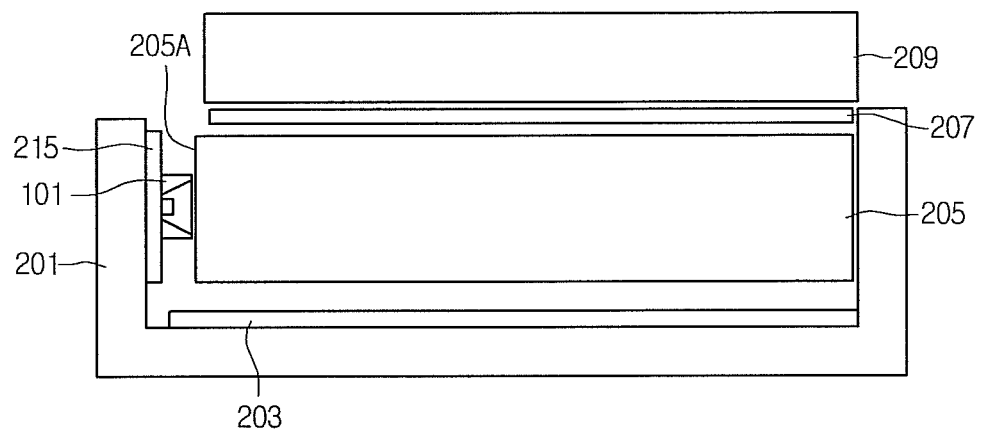
FIG. 22 is s sectional view of a light unit according to a seventeenth embodiment.

FIG. 22 is s sectional view of a light unit according to a seventeenth embodiment. A seventeenth embodiment may selectively apply the light emitting devices according to the foregoing embodiment(s). In description of this embodiment, the light emitting device will be described with reference to the above-described package.

Referring to FIG. 22, a light unit 220 includes a board 215 on which a plurality of light emitting devices 101 are arrayed, a bottom cover 201, a reflective sheet 203, a light guide plate 205, an optical sheet 207, and a display panel 209.

Each of the light emitting devices 101 has a second cavity (see reference numeral 120 of FIG. 11) and faces a side of the light guide plate 205, e.g., a light-incident part 205A.

The plurality of light emitting devices 101 may be mounted on the board 215. The board 215 may be coupled to the bottom cover 201 or a separate heatsink. The board 215 may include a flexible board, a resin PCB, a metal PCB, or a ceramic board, but is not limited thereto.

The bottom cover 201 may receive elements such as the reflective sheet 203, the light guide plate 205, and the optical sheet 207. Also, the bottom cover 201 may have vertical or inclined circumference surface. The bottom cover 201 and the circumference surface may be formed of the same material as each other or materials different from each other.

The reflective sheet 203 reflects light leaking through the light guide plate 205 or incident from the light emitting devices 101. The light guide plate 205 diffuses the light incident from the light emitting devices 101 to produce planar light. The reflective sheet 203 is disposed under the light guide plate 205. The reflective sheet 203 reflects the light leaking from the light guide plate 205. The reflective sheet 203 may be not provided. In this case, a reflective material may be coated on a bottom surface of the bottom cover 201.

The optical sheet 207 may selectively include a diffusion sheet, a prism sheet, and a brightness enhanced sheet, but is not limited thereto. The optical sheet 207 may be removed.

The display panel 209 displays information using light incident into a liquid crystal display (LCD).

Figure 23:
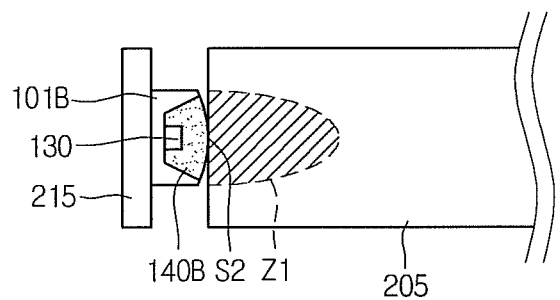
FIG. 23 is a view illustrating a limitation due to contact of a molding member of a light emitting device with a light guide plate.

FIG. 23 is a view illustrating an example of optical losses in a light guide plate due to a configuration of a molding member of a light emitting device.

Referring to FIG. 23, when a structure similar to that of the second cavity (see reference numeral 120 of FIG. 11) is not provided in a light emitting device 101B, a surface S2 of a molding member 140B may protrude in a convex lens shape. The surface S2 of the molding member 140B may contact a light-incident part of a light guide plate 205. Heat generated from a light emitting chip 130 is transmitted from the molding member 140B to the light guide plate 205 by an operation of the light emitting device 101B. Here, optical losses due to a thermal expansion coefficient difference between the light guide plate 205 and the molding member 140B may occur in a light-incident region Z1 of the light guide plate 205. That is, a loss of light (e.g., blue light) having a short wavelength may occur. Due to the optical losses, the blue light may be converted into bluish light to cause color defects overall.

Figure 24:
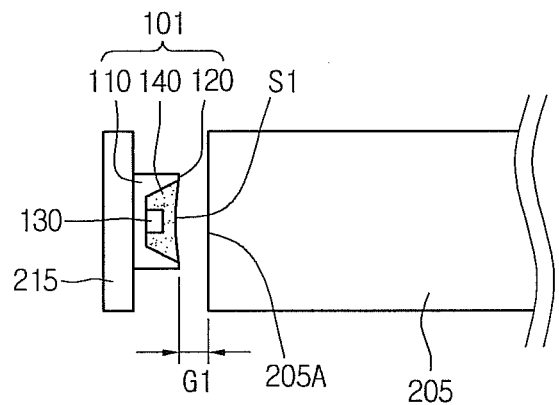
FIG. 24 is a view of the light emitting device and a light guide plate in FIG. 22.

FIG. 24 is a view of the light emitting device and the light guide plate in FIG. 22.

Referring to FIG. 24, a distance G1 between the light emitting device 101 and the light guide plate 205 may be about 0.01 mm to about 1 mm. Here, the molding member 140 may not protrude in a convex shape by the second cavity 120, but have a surface S2 having a concave lens shape. Thus, the predetermined gap G1 may be generated between the surface S1 of the molding member 140 and the light guide plate 205. Here, the gap G1 may prevent the surface S1 of the molding member 140 and the light guide plate 205 from contacting each other. Therefore, the distance between G1 between the light guide plate 205 and the light emitting device 101 may be further reduced to reduce the optical losses.

Figure 25:
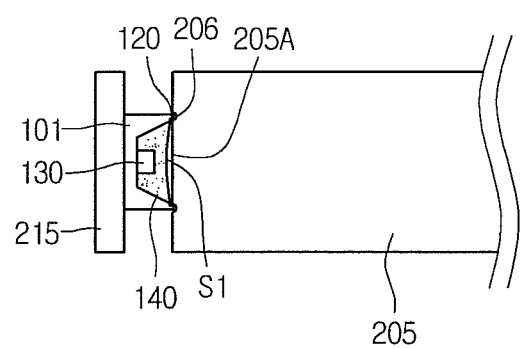
FIG. 25 is a view of a light unit according to an eighteenth embodiment.

FIG. 25 is a view of a light unit according to an eighteenth embodiment.

Referring to FIG. 25, a light unit has a structure in which a portion of a light emitting device 101 is inserted into a receiving groove 206 defined in a light-incident part 205A of a light guide plate 205. That is, an upper portion of a body of the light emitting device 101 is received into the receiving groove 206 of the light guide plate 205. A distance between a molding member 140 of the light emitting device 101 and the light guide plate 205 may be about 0.01 mm to about 0.05 mm.

Thus, a surface S1 of the molding member 140, i.e., a central portion of the surface S1 may not contact a light-incident part of the light guide plate 205 by a second cavity 120. Therefore, a distance between the light guide plate 205 and the light emitting device 101 may be reduced to reduce optical losses.

An optical sheet, a reflective plate, or a lens as well as the light guide plate may be disposed at a light emission side of the light emitting device according to an embodiment, but is not limited thereto. The light emitting device may be used for lighting devices such as street lamps and vehicle headlights, indicating devices, and signs, but is not limited thereto.

The light emitting device according to an embodiment may be applied to a light unit. The light unit has a structure in which a plurality of light emitting devices are arrayed. The light unit may include the display device shown in FIGS. 26 and 27 and the lighting device shown in FIG. 28. Furthermore, the light unit may include illumination lamps, traffic lights, vehicle headlights, and signs.

Figure 26:
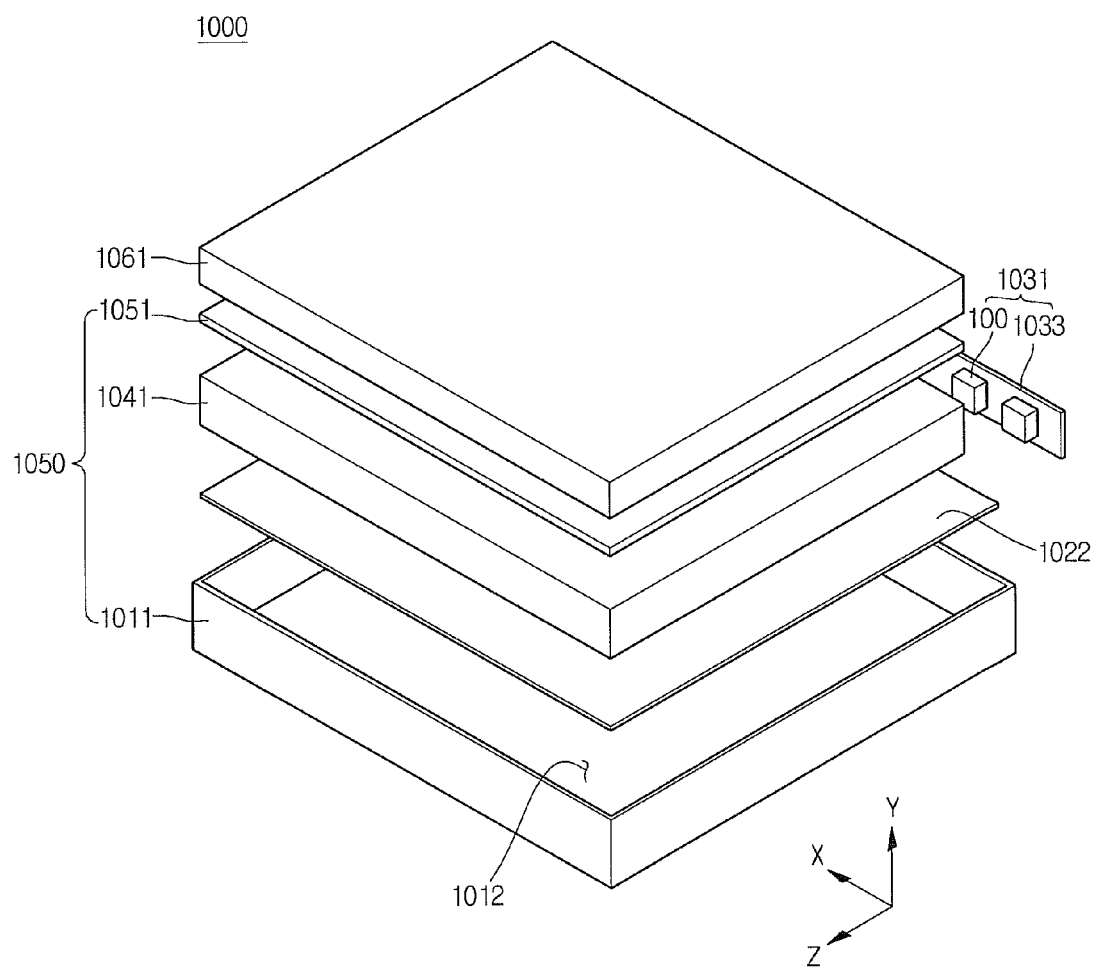
FIG. 26 is a view of a display device including a light emitting device according to an embodiment.

FIG. 26 is an exploded perspective view of a display device according to an embodiment.

Referring to FIG. 26, a display device 1000 according to an embodiment may include a light guide plate 1041, a light emitting module 1031 providing light to the light guide plate 1041, a reflective member 1022 disposed under the light guide plate 1041, an optical sheet 1051 disposed above the light guide plate 1041, a display panel 1061 disposed above the optical sheet 1051, and a bottom cover 1011 receiving the light guide plate 1041, the light emitting module 1031, and the reflective member 1022, but is not limited thereto.

The bottom cover 1011, the reflective member 1022, the light guide plate 1041, and the optical sheet 1051 may be defined as a light unit 1050.

The light guide plate 1041 diffuses light to produce planar light. The light guide plate 1041 may be formed of a transparent material. For example, the light guide plate 1041 may be fanned of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 may provide light to at least one side surface of the light guide plate 1041. Thus, the light emitting module 1031 may act as a light source of a display device.

At least one light emitting module 1031 may be disposed to directly or indirectly provide light to at least one side surface of the light guide plate 1041. The light emitting module 1031 may include a board 1033 and the light emitting device 100 according to the above-described embodiment. The light emitting device 100 may be arrayed on the board 1033 by a predetermined distance.

The board 1033 may be a printed circuit board (PCB) including a circuit pattern (not shown). Also, the substrate 1033 may include a general PCB, a metal core PCB (MCPCB), and a flexible PCB (FPCB), but is not limited thereto. When the light emitting device 100 are mounted on a side surface of the bottom cover 1011 or on a heatsink plate, the board 1033 may be removed. Here, a portion of the heatsink plate may contact a top surface of the bottom cover 1011.

The plurality of light emitting devices 100 may be mounted on the board 1033 to allow a light emitting surface through which light is emitted from the board 1033 to be spaced a predetermined distance from the light guide plate 1041, but is not limited thereto. The light emitting device 100 may directly or indirectly provide light to a light incident surface that is a side surface of the light guide plate 1041, but is not limited thereto.

The reflective member 1022 may be disposed under the light guide plate 1041. Since the reflective member 1022 reflects light incident onto an under surface of the light guide plate 1041 to supply the reflected light upward, brightness of the light unit 1050 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel and include first and second boards formed of a transparent material and facing each other and a liquid crystal layer between the first and second boards. A polarizing plate may be attached to at least one surface of the display panel 1061. The present disclosure is not limited to the attached structure of the polarizing plate. The display panel 1061 displays information using light transmitting the optical sheet 1051. The display device 1000 may be applied to various portable terminals, monitors for notebook computers, monitors for laptop computers, televisions, etc.

The optical sheet 1051 is disposed between the display panel 1061 and the light guide plate 1041 and includes at least one light-transmitting sheet. For example, the optical sheet 1051 may include at least one of a diffusion sheet, horizontal and vertical prism sheets, a brightness enhanced sheet, etc. The diffusion sheet diffuses incident light, and the horizontal or/and vertical prism sheet(s) collect(s) the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 27:
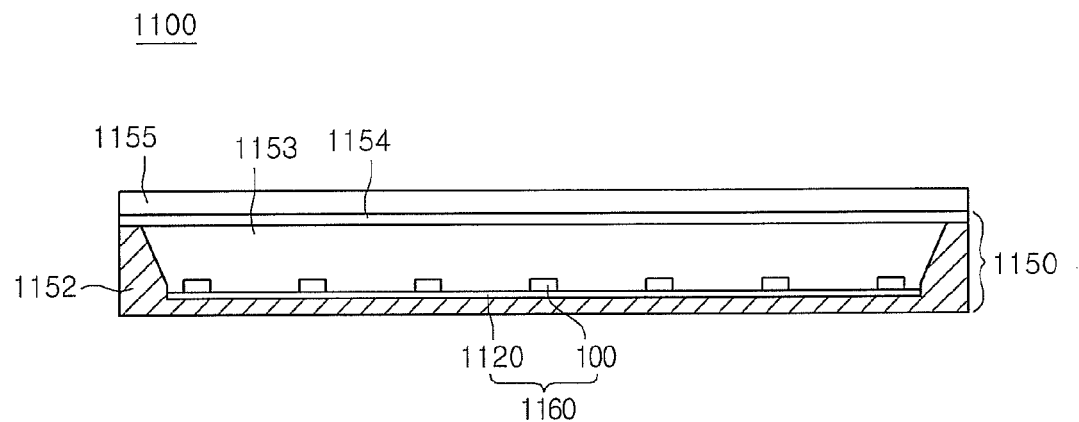
FIG. 27 is a view illustrating another example of the display device including the light emitting device according to an embodiment.

FIG. 27 is a view of a display device according to an embodiment.

Referring to FIG. 27, a display device 1100 includes a bottom cover 1152, a board 1120 on which the above-described light emitting devices 100 are arrayed, an optical member 1154, and a display panel 1155.

The board 1120 and the light emitting devices 100 may be defined as a light emitting module 1060. The bottom cover 1152, the at least one light emitting module 1060, and the optical member 1154 may be defined as a light unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into a display region. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 28:
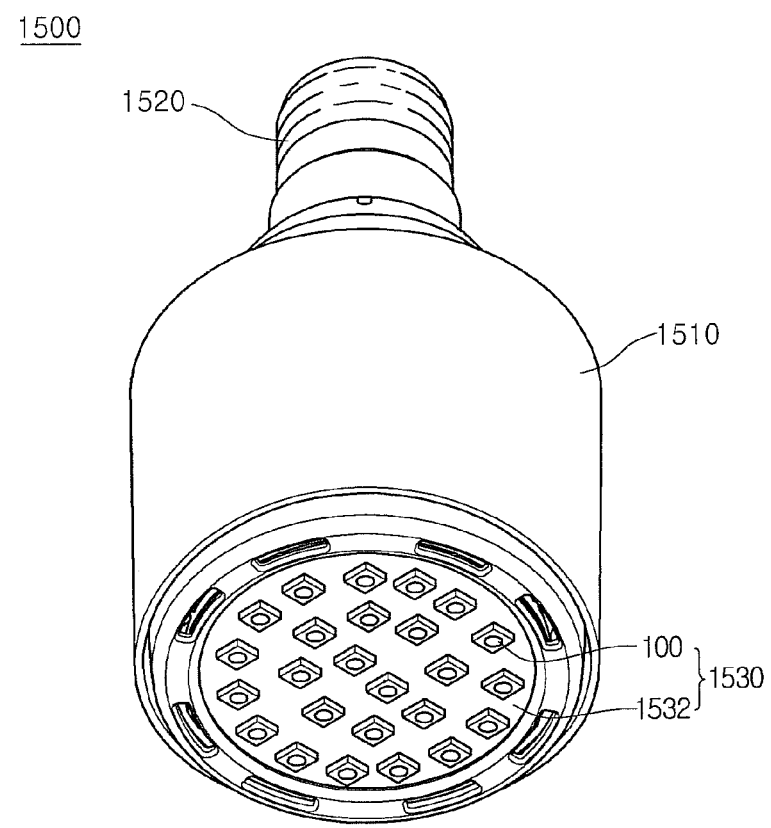
FIG. 28 is a view of a lighting device including a light emitting device according to an embodiment.

FIG. 28 is a view of a lighting device according to an embodiment.

Referring to FIG. 28, a lighting unit 1500 may include a case 1510, a light emitting module 1530 in the case 1510, and a connection terminal 1520 disposed in the case 1510 to receive an electric power from an external power source.

The case 1510 may be preferably formed of a material having good heat dissipation characteristics, for example, a metal material or a resin material.

The light emitting module 1530 may include a board 1532 and a light emitting device 100 mounted on the board 1532. The light emitting device 100 may be provided in plurality, and the plurality of light emitting devices 100 may be arrayed in a matrix form or spaced a predetermined distance from each other.

The board 1532 may be an insulator on which a circuit pattern is printed. For example, the board may include a general printed circuit board (PCB), a metal core PCB, a flexible PCB, a ceramic PCB, FR-4, etc.

Also, the board 1532 may be formed of a material to efficiently reflect light, and a surface thereof may be formed in a color capable of efficiently reflecting light. For example, the board 1532 may be a coated layer having a white color or a silver color.

At least one light emitting device 100 may be mounted on the board 1532. Each of the light emitting devices 100 may include at least one light emitting diode (LED) chip. The LED chip may include a color LED emitting red, green, blue or white light, and a UV LED emitting ultraviolet (UV) rays.

The light emitting module 1530 may have a combination of various light emitting devices 100 to obtain desired color and luminance For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screw-coupled to an external power source in a socket type, but is not limited thereto. For example, the connection terminal 1520 may be made in a pin type and inserted into the external power source or may be connected to the external power source through a wire.

The embodiments may prevent the resin material from overflowing in the LED. Also, the embodiments may prevent the resin material from protruding from the top surface of the LED. Also, the embodiments may provide a gap between the light emitting device and the light guide plate to prevent a color from being blurred in the light-incident part of the light guide plate.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a body including a resin material;
a first cavity recessed from a top surface of the body;
a first lead electrode disposed on a first region of the first cavity and disposed on the body;
a second lead electrode disposed on a second region of the first cavity and disposed on the body;
a light emitting chip disposed on at least one of the first lead electrode or the second lead electrode; and
a molding member in the first cavity, wherein the first cavity has a first side surface and a second side surface corresponding to the first side surface, wherein the first side surface of the first cavity is inclined with respect to a top surface of the first lead electrode and the second side surface is inclined with respect to a top surface of the second lead electrode, wherein the first cavity includes a first recess concaved from the first side surface, wherein the molding member includes a first protrusion in the first recess, wherein the first recess is located at a higher position than a top surface of the light emitting chip and is closer to a center region than a bottom of the first cavity, wherein the top surface of the first lead electrode and the top surface of the second lead electrode within the first cavity are substantially planar, wherein the first side surface includes a lower side surface between the first recess and the first lead electrode and an upper side between the first recess and the top surface of the body, and wherein the lower side surface and the upper side surface are inclined with respect to the top surface of the first lead electrode.

2. The light emitting device according to claim 1, wherein the first cavity includes a second recess concaved from the second side surface, wherein the molding member includes a second protrusion in the second recess, wherein the second recess is located at a higher position than the top surface of the light emitting chip, and wherein an interval between the first protrusion and the second protrusion is smaller than a width of a top surface of the molding member.

3. The light emitting device according to claim 1, wherein the first recess is located at a lower position than a top surface of the molding member, wherein the lower side surface and the upper side surface are inclined at a same angle as the first side surface with respect to the top surface of the first lead electrode.

4. The light emitting device according to claim 3, further comprising a second cavity recessed from the top surface of the body, wherein the second cavity is disposed between the first side surface of the first cavity and a first sidewall of the body.

5. The light emitting device according to claim 4, further comprising a third cavity recessed from the top surface of the body, wherein the third cavity is disposed between the second side surface of the first cavity and a second sidewall of the body, wherein the second sidewall of the body is opposite to the first sidewall of the body.

6. The light emitting device according to claim 4, wherein the second cavity is located at an outer position than that of a top region of the second side surface of the first cavity.

7. The light emitting device according to claim 2, further comprising a wire connected to the light emitting chip and the second lead electrode, wherein the first recess is located at a higher position than that of the highest point of the wire, wherein the first recess, the first cavity, and the light emitting chip are vertically overlapped with the first lead electrode in a vertical direction.

8. The light emitting device according to claim 4, wherein the second cavity has an upper width greater than a lower width thereof.

9. The light emitting device according to claim 4, wherein at least one of side surfaces of the second cavity is formed in a substantially vertical side surface with respect to the top surface of the body.

10. The light emitting device according to claim 4, wherein the second cavity is disposed between the first cavity and the first sidewall of the body, and wherein the lower side surface and the upper side surface are substantially planar.

11. The light emitting device according to claim 5, wherein the first and second cavities have he same depth as each other.

12. A light emitting device, comprising:
a body having a first cavity;
a first lead electrode in the first cavity;
a second lead electrode spaced apart from the first lead electrode in the first cavity;
a light emitting chip disposed on at least one of the first lead electrode or the second lead electrode;
a molding member in the first cavity;
a first recess disposed on a periphery region of the first cavity; and
a first protrusion that protrudes from the molding member and disposed in the first recess, wherein the first protrusion is located at a higher position than a top surface of the light emitting chip, wherein the first protrusion is closer to the light emitting chip than a sidewall of the body and is adjacent to a center region of the first side surface, wherein top surfaces of the first lead electrode and the second lead electrode within the first cavity are substantially planar, wherein the first side surface includes a lower side surface between the first recess and the first lead electrode and an upper side surface between the first recess and the top surface of the body, wherein the lower side surface and the upper side surface are inclined with respect to the top surface of the first lead electrode, and wherein the lower side surface and the upper side surface are substantially planar.

13. The light emitting device according to claim 12, wherein the first cavity includes a second recess concaved from the second side surface, wherein the molding member includes a second protrusion in the second recess, wherein the second protrusion is closer to the light emitting chip than a sidewall of the body.

14. The light emitting device according to claim 13, wherein an interval between the first protrusion and the second protrusion is smaller than a width of a top surface of the molding member.

15. The light emitting device according to claim 12, wherein the first recess is between the first cavity and the first sidewall of the body, and wherein the lower side surface and the upper side surface are inclined at a same angle as the first side surface of the first cavity with respect to the top surface of the first lead electrode.

16. The light emitting device according to claim 12, further comprising a second cavity adjacent to the top surface of the body.

17. The light emitting device according to claim 16, wherein the second cavity has an upper width greater than a lower width thereof.

18. The light emitting device according to claim 16, wherein the first recess has a volume smaller than a volume of the second cavity.

19. The light emitting device according to claim 16, wherein a portion of the molding member is disposed in the second cavity.

20. The light emitting device according to claim 12, further comprising a wire connected to the light emitting chip and the second lead electrode, wherein the first recess is located at a higher position than that of the highest point of the wire, wherein the first recess, the first cavity, and the light emitting chip are vertically overlapped with the first lead electrode in a vertical direction.

* * * * *